(12) United States Patent
Gao et al.

(10) Patent No.: US 9,177,575 B1
(45) Date of Patent: Nov. 3, 2015

(54) TUNNELING MAGNETORESISTIVE (TMR) READ HEAD WITH REDUCED GAP THICKNESS

(71) Applicant: HGST Netherlands B.V., Amsterdam (NL)

(72) Inventors: Zheng Gao, San Jose, CA (US); Sangmun Oh, San Jose, CA (US); Susumu Okamura, San Jose, CA (US)

(73) Assignee: HGST Netherlands B.V., Amsterdam (NL)

( * ) Notice: Subject to any disclaimer, the term of this patent is extended or adjusted under 35 U.S.C. 154(b) by 0 days.

(21) Appl. No.: 14/561,265

(22) Filed: Dec. 5, 2014

(51) Int. Cl.
G11B 5/39 (2006.01)
(52) U.S. Cl.
CPC ............... *G11B 5/3909* (2013.01); *G11B 5/39* (2013.01)
(58) Field of Classification Search
CPC ............ G11B 5/33; G11B 5/332; G11B 5/39; G11B 5/3903; G11B 5/3909; G11B 5/3929; G11B 5/3932; G11B 2005/3996
USPC .................. 360/324.1, 324.11, 324.12, 324.2
See application file for complete search history.

(56) References Cited

U.S. PATENT DOCUMENTS

| | | | |
|---|---|---|---|
| 7,224,556 B2 | 5/2007 | Pinarbasi | |
| 7,961,440 B2 | 6/2011 | Gill et al. | |
| 8,238,063 B2 | 8/2012 | Qiu et al. | |
| 8,243,401 B2 * | 8/2012 | Lin | 360/324.2 |
| 8,451,566 B2 * | 5/2013 | Lin | 360/324.11 |
| 8,537,504 B2 * | 9/2013 | Lin | 360/324.11 |
| 8,711,528 B1 | 4/2014 | Xiao et al. | |
| 2007/0217077 A1 * | 9/2007 | Kanaya et al. | 360/313 |
| 2011/0273802 A1 | 11/2011 | Zhou et al. | |
| 2012/0146167 A1 * | 6/2012 | Huai et al. | 257/421 |
| 2012/0164485 A1 * | 6/2012 | Lin | 428/811.3 |
| 2012/0181537 A1 * | 7/2012 | Cao et al. | 257/53 |
| 2014/0133052 A1 | 5/2014 | Meguro et al. | |
| 2014/0154529 A1 | 6/2014 | Yang et al. | |
| 2014/0210024 A1 | 7/2014 | Lin | |
| 2014/0313617 A1 * | 10/2014 | Katine | 360/236.5 |

* cited by examiner

*Primary Examiner* — Jefferson Evans
(74) *Attorney, Agent, or Firm* — Thomas R. Berthold

(57) ABSTRACT

A tunneling magnetoresistive (TMR) read head has a read gap with a reduced thickness. A multilayer seed layer includes a first ferromagnetic seed layer on the lower shield, a ferromagnetic NiFe alloy on the first seed layer, and a third seed layer of Ru or Pt on the NiFe seed layer. The first and NiFe seed layers are magnetically part of the lower shield, thereby effectively reducing the read gap thickness. A free layer/capping layer structure includes a multilayer ferromagnetic free layer and a Hf capping layer on the free layer. The free layer includes a B-containing upper layer in contact with the Hf capping layer prior to annealing. When the sensor is annealed Hf diffuses into the B-containing upper layer, forming an interface layer. The Hf-containing interface layer possesses negative magnetostriction, so the free layer is not required to contain NiFe.

20 Claims, 5 Drawing Sheets ic (TMR) READ HEAD WITH REDUCED GAP THICKNESS

BACKGROUND OF THE INVENTION

1. Field of the Invention

The invention relates generally to tunneling magnetoresistance (TMR) devices, and more particularly to a TMR read head with an improved seed layer and free ferromagnetic layer/capping layer structure that enables a reduction in the read gap thickness.

2. Description of the Related Art

A tunneling magnetoresistance (TMR) device, also called a magnetic tunneling junction (MTJ) device, is comprised of two ferromagnetic layers separated by a thin insulating tunneling barrier layer. The barrier layer is typically made of a metallic oxide, typically MgO, that is so sufficiently thin that quantum-mechanical tunneling of charge carriers occurs between the two ferromagnetic layers. This quantum-mechanical tunneling process is electron spin dependent, which means that an electrical resistance measured when applying a sense current across the junction depends on the spin-dependent electronic properties of the ferromagnetic and barrier layers, and is a function of the relative orientation of the magnetizations of the two ferromagnetic layers. The magnetization of the first ferromagnetic layer is designed to be pinned, while the magnetization of the second ferromagnetic layer is designed to be free to rotate in response to external magnetic fields. The relative orientation of their magnetizations varies with the external magnetic field, thus resulting in change in the electrical resistance.

The TMR device is usable as a TMR read head in magnetic recording disk drives. The linear density of the bits in the data tracks of the disk is dependent on the along-the-track dimension of the TMR read head. Thus it is desirable to make this dimension, also called the read gap, as small as possible, but without a loss in magnetoresistance (ΔR/R) and designed magnetic properties, so that the read head can detect smaller-sized bits and still maintain the reading performance.

SUMMARY OF THE INVENTION

In embodiments of this invention, the TMR read head has a read gap with a reduced thickness. A multilayer seed layer below the antiferromagnetic layer is magnetically coupled to the lower shield S1 and thus acts as part of the shield rather than part of the sensor. An improved free layer/capping layer structure provides the free layer with negative magnetostriction and thus allows for the elimination of NiFe from the free layer.

The multilayer seed layer includes a first ferromagnetic seed layer on lower shield S1 and selected from a CoHf alloy and an alloy of B and one or more of Co, Ni and Fe, a second seed layer consisting of a ferromagnetic NiFe alloy on the first seed layer and magnetically coupled to lower shield S1, and a third seed layer selected from Ru and Pt on the second seed layer. The antiferromagnetic layer is on and in contact with the third seed layer. An optional fourth seed layer of Ru may be located between the first and second seed layers. The first and second ferromagnetic seed layers are magnetically part of lower shield S1, thereby effectively reducing the read gap thickness. The multilayer seed layer thus has only the upper non-magnetic Ru or Pt third seed layer that contributes to the effective read gap.

The improved free layer/capping layer structure includes a multilayer ferromagnetic free layer and a multilayer capping layer on the free layer that includes a first capping layer consisting of Hf. The free layer includes a CoB or CoFeB ferromagnetic upper layer in contact with the Hf first capping layer. If CoFeB is used in the upper layer it should have low Fe content, i.e., less than about 10 atomic percent (at. %), to minimize magnetostriction. One feature of the free layer is that it does not contain NiFe, which is typically used because it has negative magnetostriction. In embodiments of this invention the first capping layer consists of Hf and is required to be in contact with the B-containing upper layer prior to annealing. When the sensor is annealed a portion of the Hf diffuses into the CoB or CoFeB free layer upper layer, forming an interface layer comprising Co, Hf and B. The Hf-containing interface layer possesses negative magnetostriction when the Hf is present within a certain composition range, but at least about 5 at. %.

For a fuller understanding of the nature and advantages of the present invention, reference should be made to the following detailed description taken together with the accompanying figures.

DETAILED DESCRIPTION OF THE INVENTION

Figure 1:
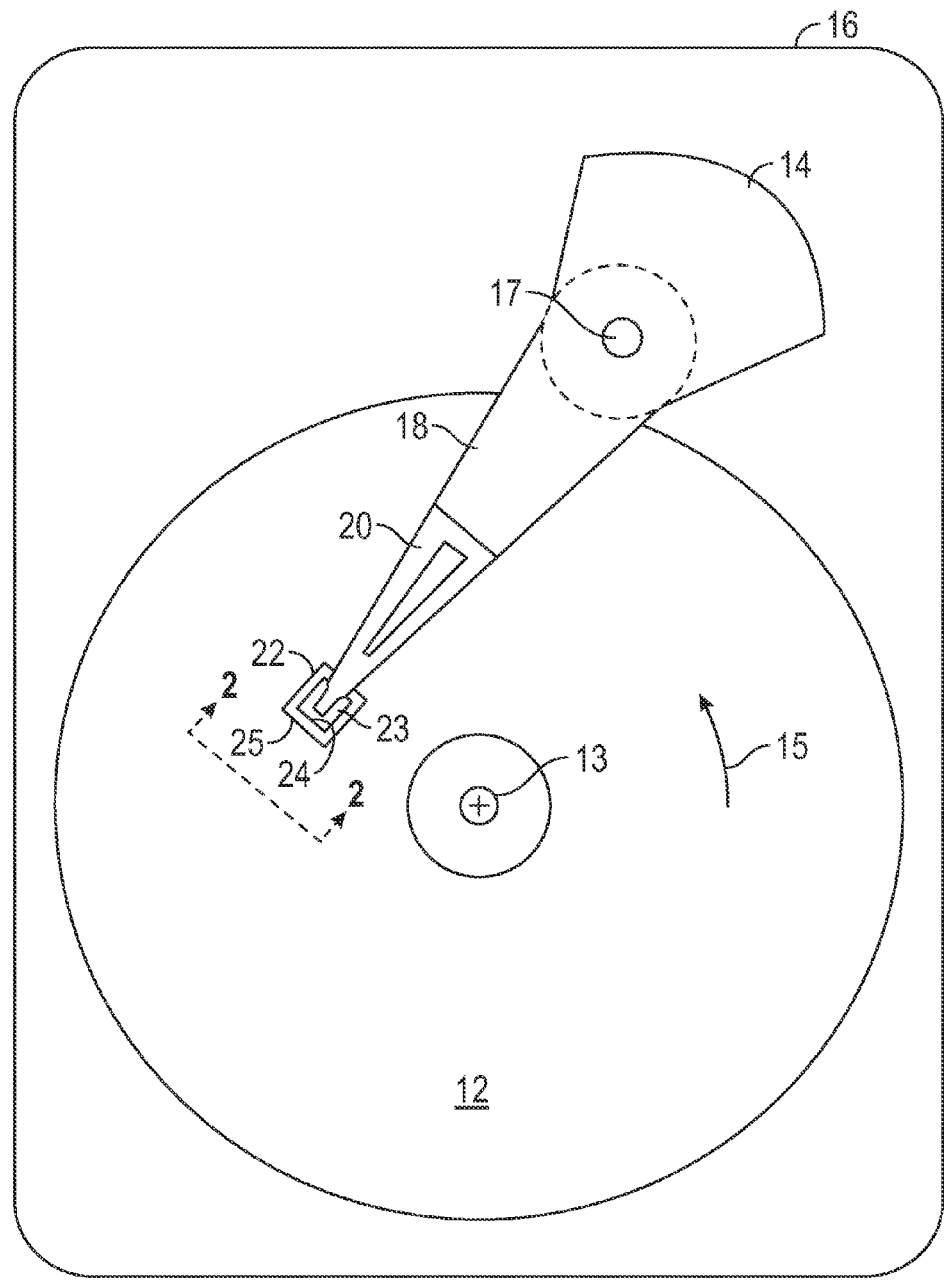
FIG. 1 is a schematic top view of a conventional magnetic recording hard disk drive with the cover removed.

The tunneling magnetoresistive (TMR) sensor of this invention has application for use in a magnetic recording disk drive, the operation of which will be briefly described with reference to FIGS. 1-3. FIG. 1 is a block diagram of a conventional magnetic recording hard disk drive. The disk drive includes a magnetic recording disk 12 and a rotary voice coil motor (VCM) actuator 14 supported on a disk drive housing or base 16. The disk 12 has a center of rotation 13 and is rotated in direction 15 by a spindle motor (not shown) mounted to base 16. The actuator 14 pivots about axis 17 and includes a rigid actuator arm 18. A generally flexible suspension 20 includes a flexure element 23 and is attached to the end of arm 18. A head carrier or air-bearing slider 22 is attached to the flexure 23. A magnetic recording read/write head 24 is formed on the trailing surface 25 of slider 22. The flexure 23 and suspension 20 enable the slider to "pitch" and "roll" on an air-bearing generated by the rotating disk 12. Typically, there are multiple disks stacked on a hub that is rotated by the spindle motor, with a separate slider and read/write head associated with each disk surface.

Figure 2:
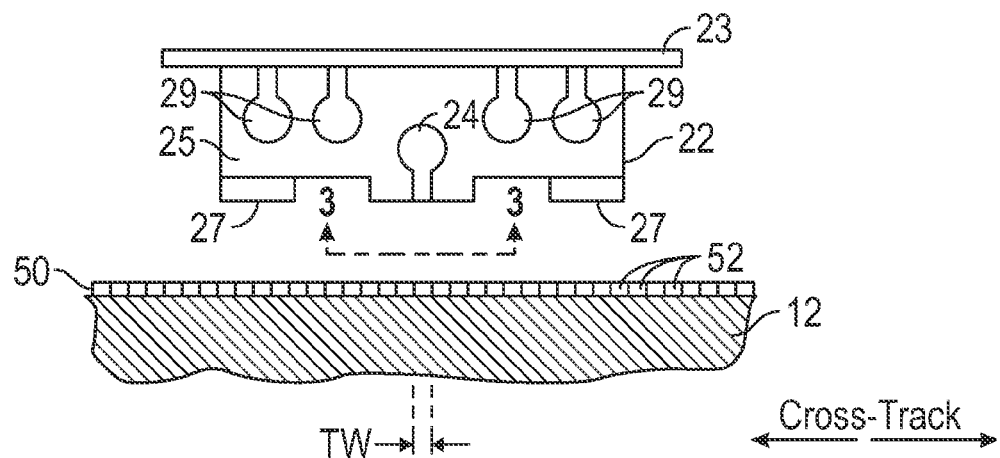
FIG. 2 is an enlarged end view of the slider and a section of the disk taken in the direction 2-2 in FIG. 1.

FIG. 2 is an enlarged end view of the slider 22 and a section of the disk 12 taken in the direction 2-2 in FIG. 1. The slider 22 is attached to flexure 23 and has an air-bearing surface (ABS) 27 facing the disk 12 and a trailing surface 25 generally perpendicular to the ABS. The ABS 27 causes the airflow from the rotating disk 12 to generate a bearing of air that supports the slider 20 in very close proximity to or near contact with the surface of disk 12. The read/write head 24 is formed on the trailing surface 25 and is connected to the disk drive read/write electronics by electrical connection to terminal pads 29 on the trailing surface 25. The disk 12 has a recording layer 50 of continuous magnetizable material with data tracks 52. The concentric data tracks with track width TW are created when the write head writes on the continuous recording layer.

Figure 3:
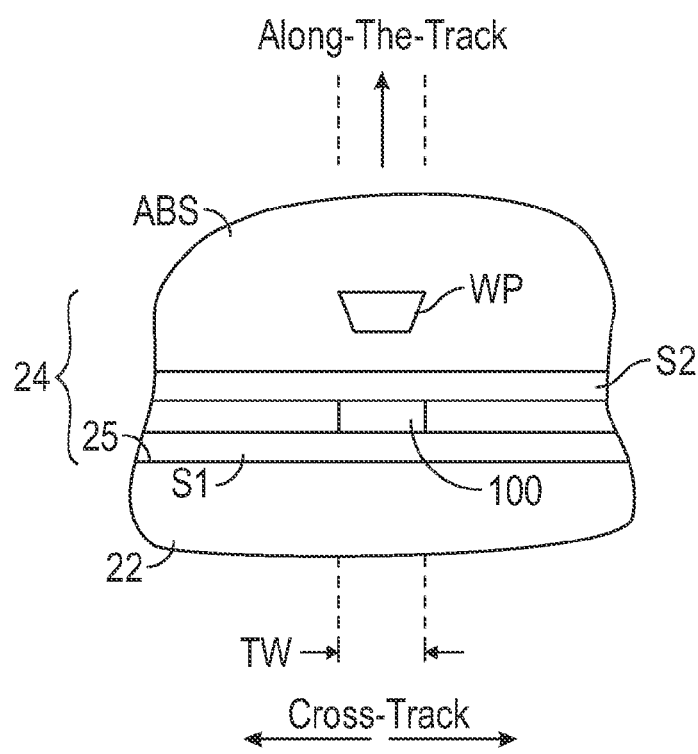
FIG. 3 is a view in the direction 3-3 of FIG. 2 and shows the ends of the read/write head as viewed from the disk.

FIG. 3 is a view in the direction 3-3 of FIG. 2 and shows the ends of read/write head 24 as viewed from the disk 12. The read/write head 24 is a series of thin films deposited and lithographically patterned on the trailing surface 25 of slider 22. The write head includes a perpendicular magnetic write pole (WP) and may also include trailing and/or side shields (not shown). The TMR sensor or read head 100 is located between two magnetic shields S1 and S2. The shields S1, S2 are formed of magnetically permeable material, typically a NiFe alloy like permalloy or a FeSiAl alloy like sendust, and may also be electrically conductive so they can function as the electrical leads to the read head 100. The shields function to shield the read head 100 from recorded data bits that are neighboring the data bit being read. FIG. 3 is not to scale because of the difficulty in showing very small dimensions. Typically each shield S1, S2 is several microns thick in the along-the-track direction, as compared to the total thickness of the read sensor 100 in the along-the-track direction, which may be in the range of 15 to 50 nm.

Figure 4:
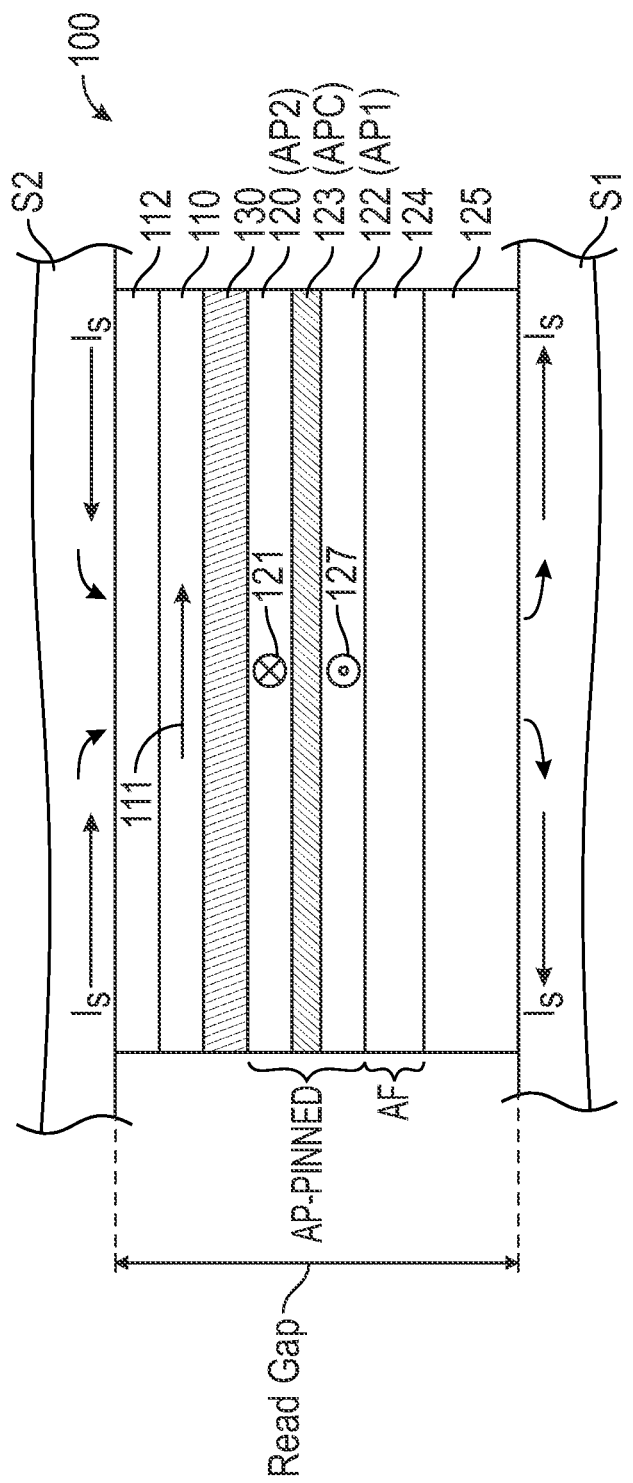
FIG. 4 is a cross-sectional view illustrating the detailed structure of a prior-art tunneling magnetoresistive (TMR) read head.

FIG. 4 is a cross-sectional view illustrating the structure of a prior-art TMR read head 100 like that used in a magnetic recording disk drive. This cross-sectional view is a view of what is commonly referred to as the air-bearing surface (ABS) of the TMR read head 100. The TMR read head 100 includes a sensor stack of layers formed between two ferromagnetic shield layers S1, S2 that are typically made of electroplated NiFe alloy films. The sensor stack includes a ferromagnetic reference layer 120 having a pinned magnetization 121 oriented transversely (away from the page), a ferromagnetic free layer 110 having a magnetization 111 that can rotate in the plane of layer 110 in response to transverse external magnetic fields from a recording disk, and an electrically insulating tunneling barrier layer 130. The free layer 110 typically includes a NiFe alloy because this material is known to have negative magnetostriction. The tunneling barrier layer 130 is typically made of magnesium oxide (MgO) or another oxide such as alumina ($Al_2O_3$) or titanium oxide ($TiO_2$).

The reference layer 120 may be a conventional "simple" or single pinned layer that has its magnetization direction 121 pinned or fixed, typically by being exchange coupled to an antiferromagnetic layer. However, in the example of FIG. 4, the reference layer 120 is part of the well-known antiparallel (AP) pinned or flux-closure structure, also called a "laminated" pinned layer, as described in U.S. Pat. No. 5,465,185. The ferromagnetic pinned and reference layers 122, 120 are typically formed of CoFe or CoFeB alloys. The AP-pinned structure minimizes magnetostatic coupling of the reference layer 120 with the free layer 110. The AP-pinned structure includes the reference ferromagnetic (AP2) layer 120 and a lower or "pinned" ferromagnetic (AP1) layer 122 that are antiferromagnetically coupled across an AP coupling (APC) layer 123, such as Ru, Ir, Rh, or Cr, or alloys thereof. Due to the antiparallel coupling across the APC layer 123, the reference (AP2) and pinned (AP1) ferromagnetic layers 120, 122 have their respective magnetizations 121, 127 oriented antiparallel to each other. As a result, the net magnetization of the AP2 and AP1 ferromagnetic layers 120, 122 is so small that a demagnetizing field induced by the flux closure structure in the ferromagnetic free layer 110 is substantially minimized.

Located between the lower shield layer S1 and the AP-pinned structure are a seed layer 125 and an antiferromagnetic (AF) pinning layer 124. The seed layer 125 facilitates the AF pinning layer 124 to grow a microstructure with a strong crystalline texture and thus develop strong antiferromagnetism. The seed layer 125 may be a single layer or multiple layers of different materials, like a Ta/Ru bilayer. The AF pinning layer 124, which is typically an IrMn alloy, thus strongly exchange-couples to the ferromagnetic pinned layer 122, and thereby rigidly pins the magnetization 127 of the ferromagnetic pinned layer 122 in a direction perpendicular to and away from the ABS. The antiparallel coupling across the APC layer 123 then subsequently rigidly pins the magnetization 121 of the ferromagnetic reference layer 120 in a direction perpendicular to and towards the ABS, and antiparallel to magnetization 127. As a result, the net magnetization of the ferromagnetic AP2 and AP1 layers 120, 122 is rigidly pinned.

Located between the ferromagnetic free layer 110 and the upper shield layer S2 is a layer 112, sometimes called a cap or capping layer. The layer 112 protects the ferromagnetic free layer 110 from chemical and mechanical damages during processing, so that ferromagnetic free layer 110 maintains ferromagnetic properties suitable for a read head. The capping layer 112 is typically made of a Ru, Ti, or Ta film or a multilayer thereof, like a Ru/Ta/Ru trilayer.

In the presence of external magnetic fields in the range of interest, i.e., magnetic fields from written data on the recording disk, while the net magnetization of the ferromagnetic layers 120, 122 remains rigidly pinned, the magnetization 111 of the ferromagnetic free layer 110 will rotate in response to the magnetic fields. Thus when a sense current $I_S$ flows from the upper shield layer S2 perpendicularly through the sensor stack to the lower shield layer S1, the magnetization 111 of the ferromagnetic free layer 110 will rotate, leading to a variation of the angle between the magnetization 121 of the ferromagnetic reference layer 120 and the magnetization 111 of the ferromagnetic free layer 110, which is detectable as a change in electrical resistance.

The TMR read head 100 with the tunneling barrier layer 130 described above and shown in FIG. 4 is fabricated in the conventional manner, wherein the layers in the sensor stack are deposited by sputter deposition or other known thin-film disposition techniques, after which the stack is lithographically patterned and etched to define the desired dimensions for the read head. The structure is then annealed, typically at about 240° C. to 280° C. for about 3 to 5 hours. The annealing is done to improve MgO crystallinity and to establish exchange bias between the antiferromagnetic layer 124 and the pinned layer 122. The annealing is done in the presence of an applied magnetic field to set the direction of the magnetization 127 of the pinned ferromagnetic layer 122.

The stack of sensor layers between the two shields S1, S2 has a thickness that is defined as the read gap. It is desirable to make the read gap as small as possible, but without a loss in magnetoresistance ($\Delta R/R$) and designed magnetic properties, so that the read head can detect smaller-sized data bits and still maintain the reading performance. To achieve higher recording density, the bit size needs to shrink and the read gap needs to be reduced to match the performance requirement.

In embodiments of this invention, the TMR read head has a read gap with a reduced thickness. A multilayer seed layer below the antiferromagnetic layer is ferromagnetically coupled to the lower shield S1 and thus acts as part of the shield rather than part of the sensor. An improved free layer/capping layer structure provides the free layer with negative magnetostriction and thus allows for the elimination of NiFe from the free layer.

Figure 5:
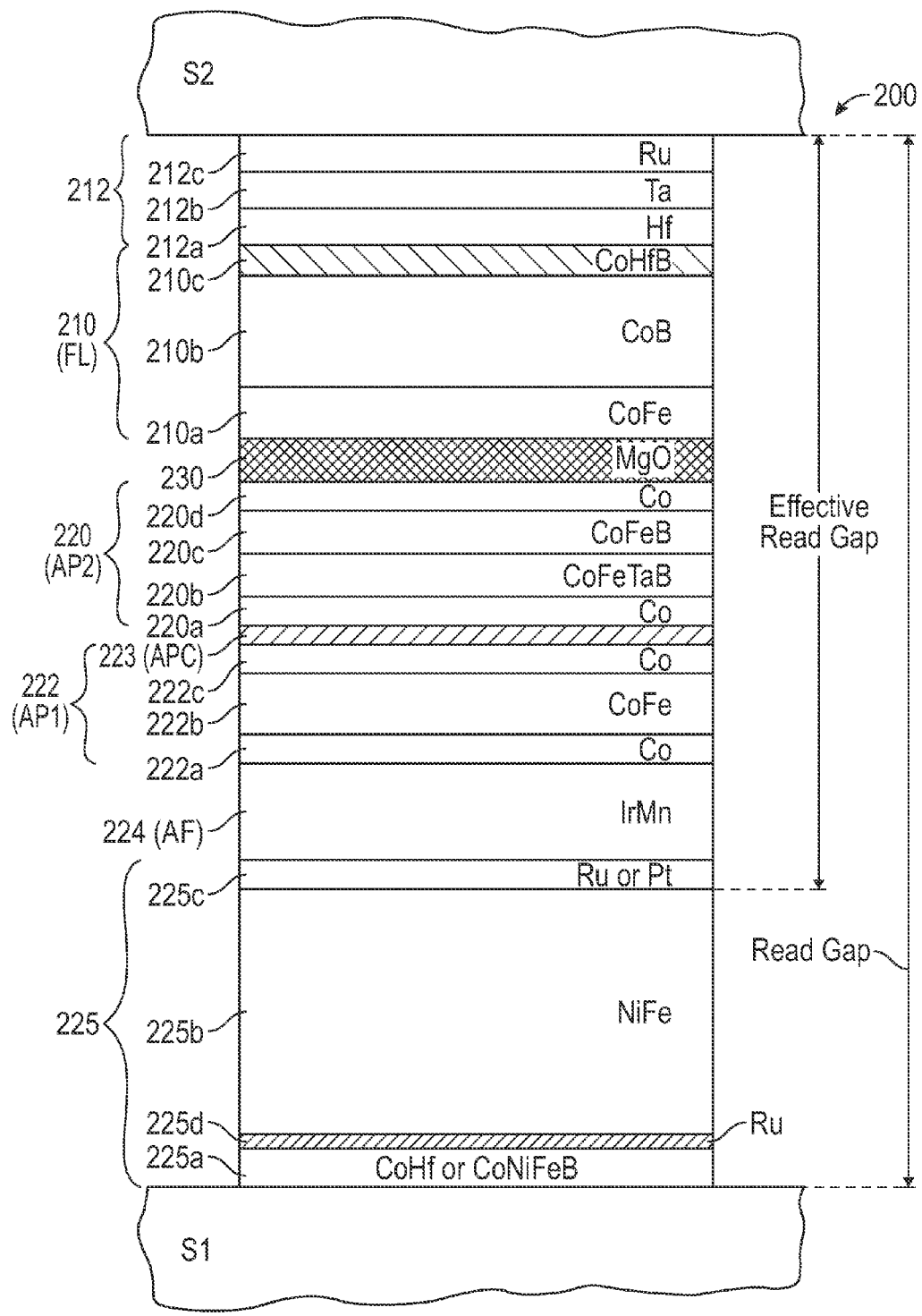
FIG. 5 is a schematic sectional view of an embodiment of the TMR read head according to the invention.

FIG. 5 is a schematic sectional view of an embodiment of the TMR read head according to the invention. The TMR read head 200 is a stack of layers located between lower shield S1 and upper shield S2. Shields S1, S2 may be formed of any of the known soft magnetically permeable materials like NiFe, but are preferably formed of a FeSiAl alloy like sendust, which has an approximate composition of $Fe_{85}Si_9Al_6$, where the subscripts are atomic percent (at. %).

The sensor 200 stack includes a multilayer seed layer 225 on S1; the AP-pinned structure of AF pinning layer 224, AP1 layer 222, APC layer 223 and AP2 layer 220; the MgO tunneling barrier layer 230; multilayer free layer 210; and multilayer capping layer 212.

The AP-pinned structure includes a Co/CoFe/Co (or CoFe) multilayer AP1 layer and a Co/CoFe/Co (or CoFe) multilayer AP2 layer. The Co or low-Fe content (less than about 25 at. %) CoFe nanolayer directly below and in contact with the MgO tunneling barrier layer 230 improves the magnetoresistance.

The multilayer seed layer 225 includes a first ferromagnetic seed layer 225a on and in contact with S1 and formed of either a CoHf alloy (with Hf between about 10 and 35 at. %) or an alloy of B and one or more of Co, Ni and Fe (with B between about 10 and 30 at. %). The first seed layer 225a has a preferred thickness between 15 and 50 Å. A second ferromagnetic seed layer 225b consists of NiFe (with Fe between about 10 and 22 at. %) and a preferred thickness between 100 and 400 Å. The first seed layer 225a has a microcrystalline structure which permits the growth of the NiFe second seed layer 225b with the desired crystalline orientation. A third seed layer of either Ru or Pt with a preferred thickness between 3 and 20 Å is formed on the second seed layer and acts to encourage the growth of the subsequently deposited IrMn AF pinning layer 224. The second seed layer 225b may be formed directly on the first seed layer. The result is that the first and second seed layers 225a, 225b are ferromagnetically coupled to the ferromagnetic shield S1. Alternatively, an optional fourth seed layer 225d of Ru with a preferred thickness between 3 and 10 Å may be located between the first and second seed layers 225a, 225b. The optional Ru layer 225d improves the grain orientation of the NiFe layer 225b but is also thin enough to form antiferromagnetic coupling between layer 225a and layer 225b. Thus the first and second ferromagnetic seed layers 225a, 225b are magnetically part of lower shield S1, thereby effectively reducing the read gap. The multilayer seed layer 225 thus has only the upper nonmagnetic Ru or Pt third seed layer 225c that contributes to the effective read gap, whereas the prior art seed layer typically required at least an additional layer of Ta.

The multilayer seed layer 225 also improves the pinning field applied to the AP1 layer 222 by the IrMn AF layer 224. The AP1 layer 222 is a trilayer of a first nanolayer 222a of Co, a high-Fe content CoFe intermediate layer 222b, and a second nanolayer of Co or CoFe with low Fe composition 222c (less than or equal to about 25 at. %), like the following structure:

Co(3 to 6 Å)/CoFe(10 to 20 Å with Fe between about 40-80 at. %)/Co or CoFe(3 to 10 Å).

Figure 6:
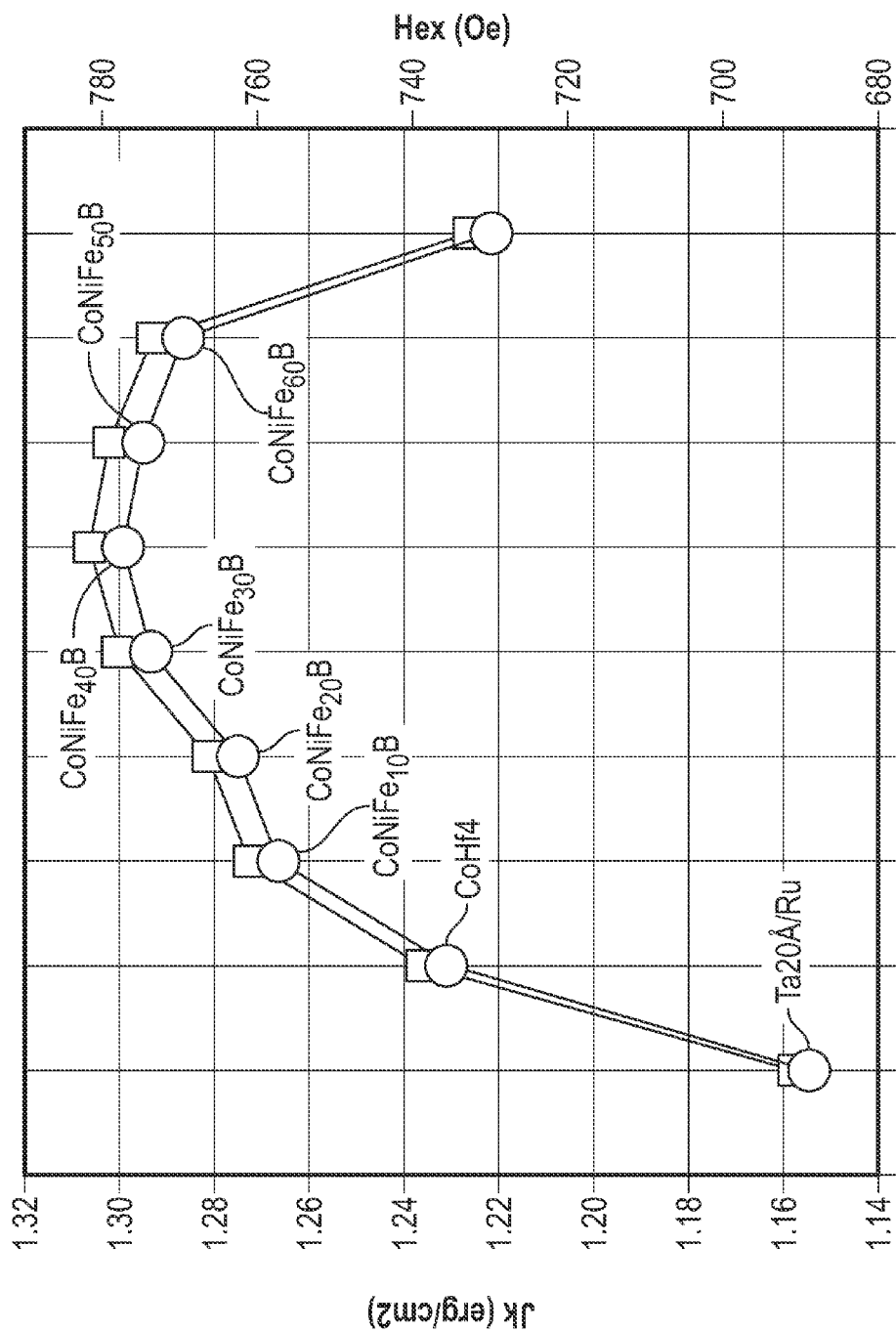
FIG. 6 is a comparison of the strength of the exchange coupling between the antiparallel-pinned AP1 layer and the antiferromagnetic (AF) layer for the prior art seed layer and for CoNiFeB multilayer seed layers with various Ni/Fe/B compositions according to embodiments of the invention.

FIG. 6 is a comparison of the strength of the exchange coupling between the AP1 layer and the AF layer for the prior art seed layer and for various multilayer seed layers according to embodiments of the invention and is measured by the unidirectional anisotropy constant, $J_K$, which is proportional to the exchange biasing field $H_{ex}$. In FIG. 6, the lowest value is for the prior art Ta/Ru seed layer. The other labeled values are for the multilayer 225 according to embodiments of the invention for various types of first seed layers 225a. The embodiment of CoHf/Ru/NiFe/Ru shows about a 6% improvement over the prior art Ta/Ru seed layer. The embodiments of CoNiFeB/Ru/NiFe/Ru show an even greater improvement over the prior art Ta/Ru seed layer for compositions with Fe between 10 and 60 at. %, with the 40 at. % Fe composition showing about a 13% improvement.

Referring again to FIG. 5, the TMR read head includes a multilayer ferromagnetic free layer 210 on MgO layer 230 and a multilayer capping layer 212 on the free layer 210 that includes a first capping layer 212a consisting of Hf. The free layer 210 comprises a ferromagnetic Fe or CoFe alloy sublayer 210a (with a preferred thickness between 2-10 Å) on and in contact with the MgO layer 230 and a ferromagnetic upper layer 210b on the sublayer 210a and that has a CoB or CoFeB layer in contact with the Hf capping layer 212a. The CoB or CoFeB upper layer has B between about 15 and 30 at. % and a preferred thickness between 20-60 Å. The upper layer 210a may also be formed as a CoB/CoFeB or CoFeB/CoB bilayer. If CoFeB is used in the upper layer 210b it should have low Fe content (less than about 10 at. %) to minimize magnetostriction. Thus the upper layer 210b in contact with the Hf first capping layer 212a may be described as CoFeB (with Fe between about 0 and 10 at. % and B between about 15 and 30 at. %).

An important feature of free layer 210 is that, unlike prior art TMR read heads, it does not contain NiFe, which is used because it has negative magnetostriction. In embodiments of this invention the first capping layer 212a consists of Hf (with a preferred thickness between about 5-20 Å) and is required to be in contact with the CoB or CoFeB upper layer 210b prior to annealing. When the sensor is annealed a portion of the Hf diffuses into the CoB, forming interface layer 210c of CoHfB. The CoHfB alloy possesses negative magnetostriction when the Hf is present within a certain composition range but at least about 5 at. %. An optional second capping layer 212b of Ta (with a preferred thickness between about 5-20 Å) may be formed on the first capping layer 210a. A third capping layer 212c of Ru (with a preferred thickness between about 10-80 Å) may be formed on the optional Ta layer 212b or directly on the Hf layer 212a.

The use of the Hf capping layer 212a in contact with the CoB (or CoFeB) upper layer 210b to create the CoHfB interface layer 210c and in combination with the CoB (CoFeB) upper layer 210b enables the elimination of a NiFe layer from the free layer. The NiFe layer in prior art TMR head free layers is typically around 20-50 Å thick. Thus embodiments of this invention result in a substantial reduction in the free layer thickness and thus a corresponding reduction in read gap thickness. In one example a TMR read head with the free layer 210 plus Hf layer 212a may have a total effective read gap thickness (the thickness as shown in FIG. 5 from and including the nonmagnetic seed layer below the IrMn layer to and including the capping layer) of about 195 Å. By comparison a TMR read head with NiFe in the free layer may have a total effective read gap thickness of 245 Å to achieve the same magnetoresistance and magnetostriction.

While the present invention has been particularly shown and described with reference to the preferred embodiments, it will be understood by those skilled in the art that various changes in form and detail may be made without departing from the spirit and scope of the invention. Accordingly, the disclosed invention is to be considered merely as illustrative and limited in scope only as specified in the appended claims.

What is claimed is:

1. A tunneling magnetoresistive (TMR) read head comprising:
   a first shield formed of magnetically permeable material;
   a multilayer seed layer on the first shield;
   an antiferromagnetic layer of IrMn on the seed layer;
   an antiparallel (AP) pinned structure comprising a first AP-pinned (AP1) ferromagnetic layer having an in-plane magnetization direction on the IrMn layer, a second AP-pinned (AP2) ferromagnetic layer having an in-plane magnetization direction substantially antiparallel to the magnetization direction of the AP1 layer, and an AP coupling (APC) layer between and in contact with the AP1 and AP2 layers;
   a MgO tunneling barrier layer on the AP2 layer;
   a ferromagnetic free layer on MgO layer and comprising a ferromagnetic Fe or CoFe alloy sublayer on and in contact with the MgO layer and a ferromagnetic CoFeB alloy upper layer on the sublayer wherein the Fe is present in the upper layer in an amount greater than or equal to about 0 atomic percent and less than or equal to about 10 atomic percent, the free layer having no NiFe alloy material; and
   a multilayer capping layer on the free layer and comprising a first capping layer consisting of Hf on the CoFeB alloy upper layer.

2. The read head of claim 1 further comprising an interface layer comprising Co, Hf and B between the CoFeB alloy upper free layer and the Hf first capping layer.

3. The read head of claim 2 wherein the Hf is present in the interface layer in an amount equal to or greater than about 5 atomic percent.

4. The read head of claim 1 wherein the first capping layer consisting of Hf has a thickness equal to or greater than 5 Å.

5. The read head of claim 1 wherein the B is present in the CoFeB upper free layer in an amount equal to or greater than about 15 atomic percent and less than or equal to about 30 atomic percent.

6. The read head of claim 1 wherein the CoFe alloy sublayer has a thickness equal to or greater than 2 Å and less than or equal to 10 Å and the CoFeB alloy upper layer has a thickness equal to or greater than 20 Å and less than or equal to 50 Å.

7. The read head of claim 1 further comprising a capping layer selected from Ta and Ru on the first capping layer.

8. The read head of claim 1 further comprising a second capping layer consisting of Ta on the first capping layer and a third capping layer consisting of Ru on the second capping layer.

9. The read head of claim 1 wherein the multilayer seed layer comprises a first ferromagnetic seed layer on, in contact with and ferromagnetically coupled to the first shield and selected from a CoHf alloy and an alloy of B and one or more of Co, Ni and Fe, wherein B is present in an amount equal to or greater than about 10 atomic percent and less than or equal to about 30 atomic percent, a second seed layer consisting of a ferromagnetic NiFe alloy on the first seed layer and magnetically coupled to the first shield, and a third seed layer selected from Ru and Pt on and in contact with the second seed layer, and wherein the IrMn layer is on and in contact with the third seed layer.

10. The read head of claim 9 further comprising a fourth seed layer consisting of Ru between and in contact with the first and second seed layers and having a thickness equal to or greater than 3 Å and less than or equal to 10 Å.

11. The read head of claim 9 wherein the first seed layer has a thickness equal to or greater than 15 Å and less than or equal to 50 Å, and the second seed layer has a thickness equal to or greater than 100 Å and less than or equal to 400 Å.

12. The read head of claim 9 wherein the AP1 layer comprises a first Co nanolayer on and in contact with the IrMn layer, a CoFe alloy intermediate layer, wherein Fe is present in an amount equal to or greater than about 40 atomic percent and less than or equal to about 80 atomic percent, on the first Co nanolayer, and a second nanolayer on the CoFe alloy intermediate layer and selected from Co and a CoFe alloy wherein Fe is present in an amount less than or equal to about 25 atomic percent.

13. The read head of claim 1 wherein the AP2 layer comprises a first Co nanolayer on and in contact with the APC layer, a CoFe alloy intermediate layer, wherein Fe is present in an amount equal to or greater than about 40 atomic percent and less than or equal to about 80 atomic percent, on the first Co nanolayer, and a second nanolayer on the CoFe alloy intermediate layer and selected from Co and a CoFe alloy wherein Fe is present in an amount less than or equal to about 25 atomic percent, and wherein the MgO tunneling barrier layer is in contact with the second nanolayer.

14. A tunneling magnetoresistive (TMR) read head comprising:
   a first shield formed of magnetically permeable material;
   a multilayer seed layer on the first shield and comprising
      a first ferromagnetic seed layer on, in contact with and ferromagnetically coupled to the first shield and selected from a CoHf alloy and an alloy of B and one or more of Co, Ni and Fe, wherein B is present in an amount equal to or greater than about 10 atomic percent and less than or equal to about 30 atomic percent,
      a second seed layer consisting of a ferromagnetic NiFe alloy on the first seed layer and magnetically coupled to the first shield, and
      a third seed layer selected from Ru and Pt on and in contact with the second seed layer;
   an antiferromagnetic layer of IrMn on and in contact with the third seed layer;
   an antiparallel (AP) pinned structure comprising a first AP-pinned (AP1) ferromagnetic layer having an in-plane magnetization direction on the IrMn layer, a second AP-pinned (AP2) ferromagnetic layer having an in-plane magnetization direction substantially antiparallel to the magnetization direction of the AP1 layer, and an AP coupling (APC) layer between and in contact with the AP1 and AP2 layers;
   a MgO tunneling barrier layer on the AP2 layer;
   a ferromagnetic free layer on MgO layer; and
   a multilayer capping layer on the free layer.

15. The read head of claim 14 further comprising a fourth seed layer consisting of Ru between and in contact with the first and second seed layers and having a thickness equal to or greater than 3 Å and less than or equal to 10 Å.

16. The read head of claim 14 wherein the first seed layer has a thickness equal to or greater than 15 Å and less than or equal to 50 Å, and the second seed layer has a thickness equal to or greater than 100 Å and less than or equal to 400 Å.

17. The read head of claim 14 wherein the AP1 layer comprises a first Co nanolayer on and in contact with the IrMn layer, a CoFe alloy intermediate layer, wherein Fe is present in an amount equal to or greater than about 40 atomic percent and less than or equal to about 80 atomic percent, on the first Co nanolayer, and a second nanolayer on the CoFe alloy intermediate layer and selected from Co and a CoFe alloy wherein Fe is present in an amount less than or equal to about 25 atomic percent.

18. The read head of claim 14 wherein the ferromagnetic free layer comprises a ferromagnetic Fe or CoFe alloy sublayer on and in contact with the MgO layer and a ferromagnetic CoFeB alloy upper layer on the sublayer wherein the Fe is present in the upper layer in an amount greater than or equal to about 0 atomic percent and less than or equal to about 10 atomic percent, the free layer having no NiFe alloy material; and a multilayer capping layer on the free layer and comprising a first capping layer consisting of Hf on the CoFeB alloy upper layer.

19. The read head of claim 18 further comprising an interface layer comprising Co, Hf and B between the CoFeB alloy upper free layer and the Hf first capping layer.

20. The read head of claim 14 wherein the first shield is formed of a material selected from a NiFe alloy and a FeSiAl alloy.

\* \* \* \* \*